(12) United States Patent
Takasuga et al.

(10) Patent No.: US 12,420,828 B2
(45) Date of Patent: Sep. 23, 2025

(54) VEHICLE BEHAVIOR CONTROL DEVICE

(71) Applicant: TOYOTA JIDOSHA KABUSHIKI KAISHA, Toyota (JP)

(72) Inventors: Kazuki Takasuga, Toyota (JP); Yuya Onozuka, Toyota (JP); Shirou Monzaki, Mishima (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 101 days.

(21) Appl. No.: 18/435,256

(22) Filed: Feb. 7, 2024

(65) Prior Publication Data

US 2024/0270307 A1 Aug. 15, 2024

(30) Foreign Application Priority Data

Feb. 10, 2023 (JP) .................... 2023-019118
Mar. 27, 2023 (JP) .................... 2023-049947
May 1, 2023 (JP) .................... 2023-075551

(51) Int. Cl.
*B60W 60/00* (2020.01)
*B60W 10/18* (2012.01)
*B60W 10/20* (2006.01)
*B62D 7/15* (2006.01)
*G06F 30/20* (2020.01)

(52) U.S. Cl.
CPC .......... *B60W 60/001* (2020.02); *B60W 10/18* (2013.01); *B60W 10/20* (2013.01); *B62D 7/159* (2013.01); *G06F 30/20* (2020.01)

(58) Field of Classification Search
CPC .... B60W 60/001; B60W 10/18; B60W 10/20; B60W 2540/10; B60W 2540/12; B60W 2540/18; B60W 2710/207; B60W 30/02; B60W 30/045; B60W 40/10; B60W 40/114; B62D 7/159; G06F 30/20
USPC ........................................ 701/41–44
See application file for complete search history.

(56) References Cited

U.S. PATENT DOCUMENTS

2009/0118905 A1   5/2009   Takenaka et al.
2022/0024464 A1   1/2022   Katsuyama
2022/0332329 A1  10/2022   Katsuyama et al.

FOREIGN PATENT DOCUMENTS

JP   2013-147097 A   8/2013
JP   2022-21715 A    2/2022
(Continued)

OTHER PUBLICATIONS

Non-Final Office Action issued Jul. 22, 2025 in U.S. Appl. No. 18/431,617.

*Primary Examiner* — Hai H Huynh
(74) *Attorney, Agent, or Firm* — Sughrue Mion, PLLC

(57) ABSTRACT

The vehicle behavior control device comprises a processor; and a memory, wherein the processor is configured to: obtain a front wheel path; calculate a front wheel curvature that is a curvature of the front wheel path at each of a plurality of front wheel passing points constituting the front wheel path; sequentially calculate, for each of the plurality of front wheel passing points, a rear wheel steering angle at which a curvature of a rear wheel path coincides with the curvature of the front wheel path at each of the plurality of front wheel passing points; and control driving of the front wheel and driving of the rear wheel based on the rear wheel steering angle that is calculated and a front wheel steering angle.

5 Claims, 6 Drawing Sheets

(56) References Cited

FOREIGN PATENT DOCUMENTS

JP        2022-165535 A     11/2022
WO     WO-2024002483 A1 *  1/2024   ......... B62D 15/0285

* cited by examiner

VEHICLE BEHAVIOR CONTROL DEVICE

CROSS REFERENCE TO RELATED APPLICATION

This application claims priority to Japanese Patent Application No. 2023-19118 filed on Feb. 10, 2023, Japanese Patent Application No. 2023-49947 filed on Mar. 27, 2023, and Japanese Patent Application No. 2023-75551 filed on May 1, 2023, which is incorporated herein by reference in its entirety including the specification, claims, drawings, and abstract.

TECHNICAL FIELD

This specification discloses a vehicle behavior control device for controlling the behavior of a vehicle.

BACKGROUND

A four-wheel steering vehicle capable of steering both a front wheel and a rear wheel of a vehicle has been known. According to such a four-wheel steering vehicle, the behavior of the vehicle can be controlled more appropriately. PATENT DOCUMENT 1 discloses a vehicle behavior control device capable of steering both front wheels and rear wheels. The apparatus described in PATENT DOCUMENT 1 calculates a target slip angle of the vehicle based on a driving instruction, corrects the target slip angle based on a road environment, and controls steering of the front wheel and the rear wheel so as to realize the corrected slip angle.

Normally, when the vehicle turns, the path of the front wheel and the path of the rear wheel deviate from each other, and an inner wheel difference and an outer wheel difference (hereinafter referred to as "wheel difference") occur. Since the driver normally steers in consideration of such wheel differences, wheel differences do not cause a significant problem. However, when a wheel difference occurs under a specific condition such as when a vehicle travels through a narrow road, the traveling control of the vehicle may be difficult. In PATENT DOCUMENT 1, no consideration is given to such an annular difference.

Accordingly, this specification discloses a vehicle behavior control device capable of matching a travel path of a rear wheel with a travel path of a front wheel.

CITATION LIST

PATENT DOCUMENT 1: JP.2013-147097.A

SUMMARY

A vehicle behavior control device disclosed herein comprises a processor; and a memory, wherein the processor is configured to: obtain a front wheel path; calculate a front wheel curvature that is a curvature of the front wheel path at each of a plurality of front wheel passing points constituting the front wheel path; sequentially calculate, for each of the plurality of front wheel passing points, a rear wheel steering angle at which a curvature of a rear wheel path coincides with the curvature of the front wheel path at each of the plurality of front wheel passing points; and control driving of the front wheel and driving of the rear wheel based on the rear wheel steering angle that is calculated and a front wheel steering angle.

According to the vehicle behavior control device disclosed in this specification, the travel path of the rear wheel can coincide with the travel path of the front wheel.

BRIEF DESCRIPTION OF DRAWINGS

Embodiment(s) of the present disclosure will be described based on the following figures, wherein.

DESCRIPTION OF EMBODIMENTS

Figure 1:
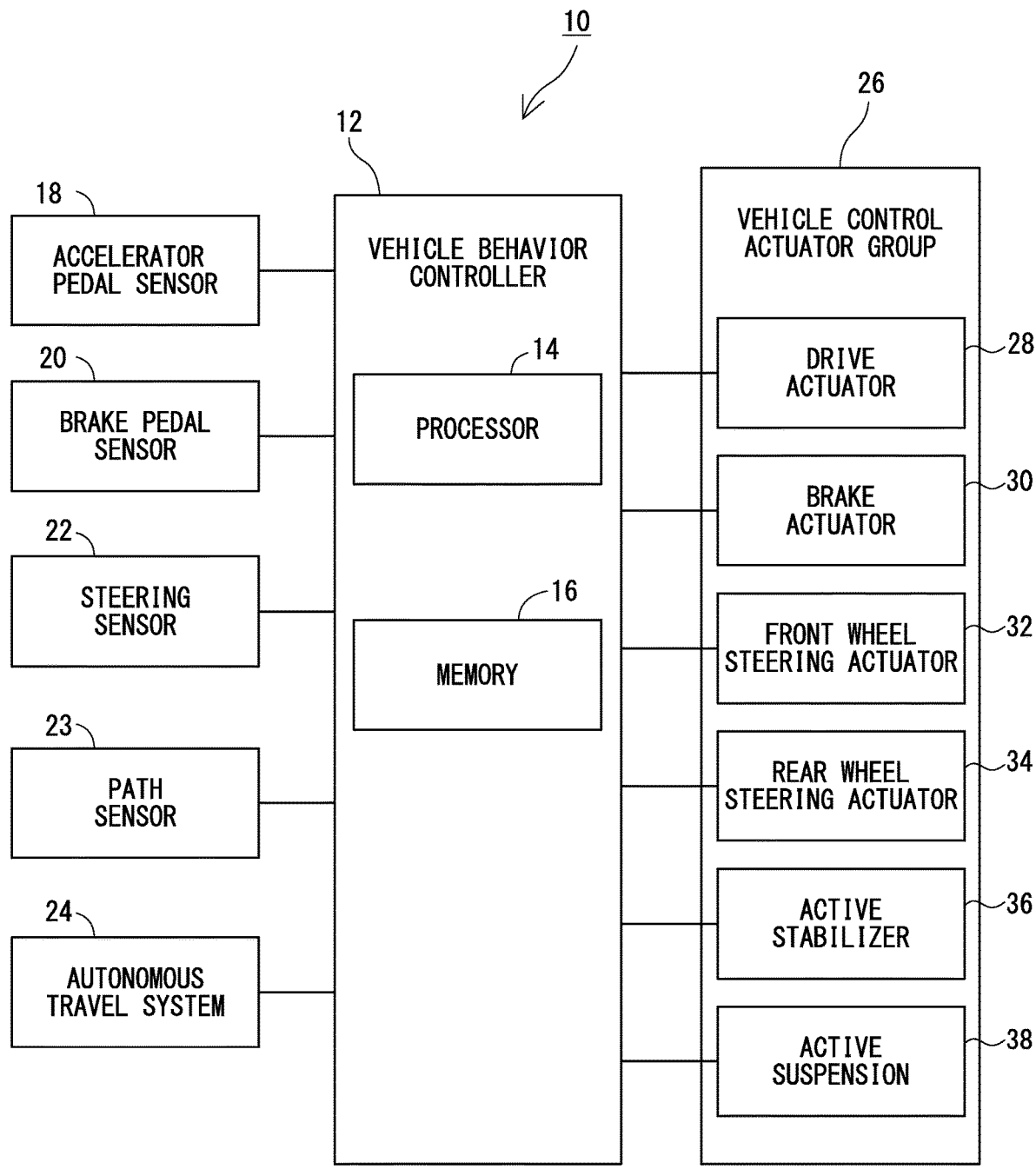
FIG. 1 is a block diagram showing a configuration of a vehicle behavior control device.

Hereinafter, the configuration of the vehicle behavior control device 10 will be described with reference to the drawings. FIG. 1 is a block diagram showing a configuration of a vehicle behavior control device 10. The vehicle behavior control device shown in FIG. 1 is applied to a four-wheel vehicle.

The vehicle behavior control device 10 controls the behavior of the vehicle based on the driving instruction. The driving instruction is an instruction for acceleration/deceleration and steering of the vehicle. For example, a driver of a vehicle operates an accelerator pedal, a brake pedal, and a steering wheel to output a driving instruction. The driver's operation amount is detected by the accelerator pedal sensor 18, the brake pedal sensor 20, and the steering sensor 22, and is input to the vehicle behavior controller 12 as a driving instruction. When the vehicle is autonomously traveling by the autonomous travel system 24, the autonomous travel system 24 outputs a driving instruction. The autonomous travel system 24 is a system for executing automatic driving or advanced driving support. The autonomous travel system 24 includes a plurality of sensors and a computer, and automatically controls acceleration/deceleration and steering of the vehicle. The path sensor 23 detects a path of the front wheel 40. The path sensor 23 is, for example, a GPS that sequentially detects the position of the front wheel 40.

The vehicle behavior controller 12 controls the behavior of the vehicle, in particular, steering, based on the driving instruction. The details of the control by the vehicle behavior controller 12 will be described later. The vehicle behavior controller 12 is physically a computer that includes a processor 14 and a memory 16. In FIG. 1, the vehicle behavior controller 12 is illustrated as a single computer. However, the vehicle behavior controller 12 may be composed of a plurality of physically separate computers. Also, some or all of the vehicle behavior controller 12 may function as part of the autonomous travel system 24. Further, a portion of the vehicle behavior controller 12 may be located outside the vehicle. In this case, the vehicle behavior controller 12 has a wireless communication function.

The vehicle control actuator group 26 includes a plurality of actuators for controlling the behavior of the vehicle. For example, the vehicle control actuator group 26 includes a drive actuator 28, a brake actuator 30, a front wheel steering actuator 32, a rear wheel steering actuator 34, an active stabilizer 36, and an active suspension 38.

The drive actuator 28 controls, for example, the amount of air supplied to the engine (throttle opening degree) in accordance with a control command from the vehicle behavior controller 12, thereby controlling the driving force of the vehicle. When the vehicle is equipped with a motor (not shown) as a power source, the vehicle behavior controller 12 outputs a control command to the motor to control the driving force. In this case, the motor corresponds to the drive actuator 28. The drive actuator 28 may change the distribution of the drive force for the front wheels and the drive force for the rear wheels. The brake actuator 30 controls a brake system (not shown) in accordance with, for example, a control command from the vehicle behavior controller 12, thereby controlling a braking force of the vehicle.

The front wheel steering actuator 32 controls the steering angle of the front wheel in accordance with a control command from the vehicle behavior controller 12. The rear wheel steering actuator 34 controls the steering angle of the rear wheel in accordance with a control command from the vehicle behavior controller 12.

The active stabilizer 36 controls a twist angle of a stabilizer bar (not shown) in accordance with a control command from the vehicle behavior controller 12. The active suspension 38 controls suspension characteristics in accordance with a control command from the vehicle behavior controller 12.

Next, the control of the vehicle behavior by the vehicle behavior controller 12 will be described. The vehicle behavior controller 12 calculates a slip angle B, a vehicle velocity Vv, and a yaw rate θ at the center of gravity of the vehicle, which are necessary to realize a desired behavior, based on the driving instruction. Subsequently, the vehicle behavior controller 12 performs six-component force control processing using the calculated slip angle B, vehicle velocity Vv, and yaw rate θ as inputs.

The six-component force control process is a process of controlling the steering and driving force of the front wheel and the rear wheel based on the behavior at the center of gravity of the vehicle. The behavior at the center of gravity of the vehicle is, for example, a slip angle B at the center of gravity of the vehicle, a vehicle velocity Vv, and a yaw rate θ. In the six-component force control process, the vehicle behavior controller 12 calculates a six-component force at the center of gravity of the vehicle based on the slip angle B and the like. The vehicle behavior controller 12 outputs a control command to the vehicle control actuator group 26 so that the calculated Six-component force at center of gravity is output. This six-component force control processing is disclosed, for example, in JP 2022-021715 A and JP 2022-165535 A. Therefore, only the outline of the six-component force control processing will be briefly described below. FIG. is a flowchart showing the flow of six-component force control processing.

Six-component force at center of gravity includes a longitudinal force Fx, a lateral force Fy, a vertical force Fz, a roll moment Mx, a pitch moment My, and a yaw moment Mz at the center of gravity of the vehicle. The vehicle behavior controller 12 calculates the plane three-component force by applying the slip angle B, the vehicle velocity Vv, and the yaw rate θ to a well-known conversion expression (S10). The plane three-component force includes a longitudinal force Fx, a lateral force Fy, and a yaw moment Mz.

Subsequently, the vehicle behavior controller 12 calculates Three-component force on spring by applying the obtained plane three-component force to the inertial motion model (S12). The inertial motion model is a vehicle model considering inertial force and suspension reaction force. The Three-component force on spring includes a vertical force Fz, a roll moment Mx, and a pitch moment My.

Six-component force at center of gravity (Fx, Fy, Fz, Mx, My, Mz) is composed of Three-component force on spring (Fz, Mx, My) and plane three-component force (Fx, Fy, Mz). The vehicle behavior controller 12 calculates the tire three-component force for each of the four wheels based on the calculated Six-component force at center of gravity (S14). The tire three-component force includes a longitudinal force Fxi, a lateral force Fyi, and a vertical force Fzi of the tire. Subsequently, the vehicle behavior controller 12 calculates a control command based on the calculated tire three-component force and outputs the control command to the vehicle control actuator group 26 (S16). As apparent from the above description, the vehicle behavior controller 12 disclosed in the present specification can appropriately control the behavior of the vehicle based on the slip angle B, the vehicle velocity Vv, and the yaw rate θ by using the six-component force control processing described above.

Here, as described above, in order to acquire the slip angle B, the vehicle velocity Vv, and the yaw rate θ, the target velocity vector VECf of the front wheel 40 and the target velocity vector VECr of the rear wheel 42 are required. The target velocity vector VECf of the front wheel 40 is defined by the front wheel steering angle Bf and the front wheel velocity Vf. The target velocity vector VECr of the rear wheel 42 is defined by the rear wheel steering angle Br and the rear wheel velocity Vr.

Normally, the front wheel steering angle Bf and the front wheel velocity Vf are calculated from the driving instruction. The rear wheel velocity Vr is the same as the front wheel velocity Vf. The rear wheel steering angle Br is often set according to a natural event. When the rear wheel steering angle Br is set according to the natural event, when the vehicle turns, an inner wheel difference and an outer wheel difference (hereinafter collectively referred to as "wheel difference") are generated in which the rear wheel path Tr deviates from the front wheel path Tf. Such wheel differences may be problematic under certain conditions, such as when a vehicle passes a narrow road.

Accordingly, the vehicle behavior controller 12 disclosed in the present specification calculates the target velocity vectors VECf and VECr so that the front wheels and the rear wheels 42 pass through the same path when requested by the driver or the autonomous travel system 24. Here, when the rear wheel 42 passes through the same path as the front wheel 40, the rear wheel 42 moves on the rut formed by the front wheel 40. Therefore, in the following description, a traveling mode in which the path of the rear wheel 42 coincides with the path of the front wheel 40 is referred to as "rut travel".

The principle of calculation of the target velocity vectors VECf and VECr for rut travel will be described below. In the following description, the curvature of the front wheel path Tf is referred to as "front wheel curvature Kf" and the curvature of the rear wheel path Tr is referred to as "rear wheel curvature Kr". Further, a point on the front wheel path Tf is referred to as a "front wheel passing point".

Figure 2:
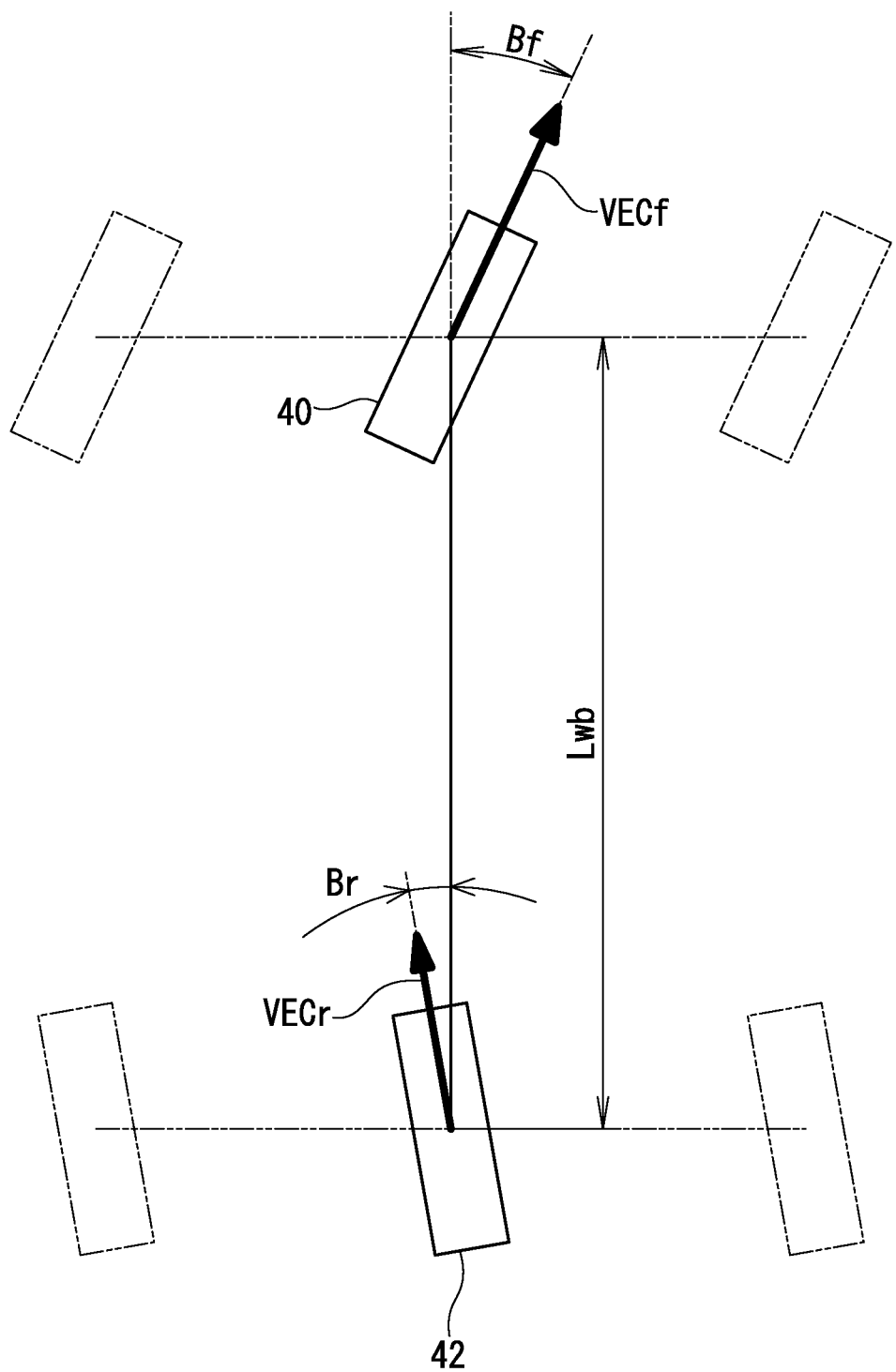
FIG. 2 is a schematic diagram of a two-wheel model.

The target velocity vectors VECf and VECr are calculated based on the two-wheel model. FIG. 2 is a schematic diagram of a two-wheel model. In the two-wheel model, the front wheel curvature Kf and the rear wheel curvature Kr are expressed by the following expressions (1) and (2). In the expressions (1) and (2), Lwb is the wheel base Lwb. The wheel base Lwb is a known constant. As described above, the front wheel steering angle Bf and the front wheel velocity Vf are calculated from the driving instruction.

$$Kf = \frac{1}{Lwb} \times \frac{\sin(Bf - Br)}{\cos Br} + \frac{1}{Vf} \frac{dBf}{dt} \quad (1)$$

$$Kr = \left(\frac{1}{Lwb} \times \frac{\sin(Bf - Br)}{\cos Br} Vf + \frac{dBr}{dt}\right) \frac{\cos Br}{\cos Bf} \frac{1}{Vf} \quad (2)$$

In the case of rut travel, the vehicle behavior controller 12 sequentially turns the rear wheel 42 so that the rear wheel curvature Kr at the front wheel passing point coincides with the front wheel curvature Kf in a state where the rear wheel 42 is positioned at the front wheel passing point. At each of the plurality of passing points, the rear wheel path Tr coincides with the front wheel path Tf by making the rear wheel curvature Kr coincide with the front wheel curvature Kf.

In order to realize such control, the vehicle behavior controller 12 sequentially acquires the front wheel curvature Kf at each of the plurality of front wheel passing points, and temporarily stores the front wheel curvature Kf in the memory 16. The front wheel curvature Kf may be calculated, for example, from a result detected by the path sensor 23. That is, the vehicle behavior controller 12 calculates the front wheel path Tf from the detection result of the path sensor 23. Further, the vehicle behavior controller 12 calculates the front wheel curvature Kf at each of the front wheel passing points from the front wheel path Tf. Alternatively, the vehicle behavior controller 12 may calculate the front wheel curvature Kf by sequentially performing the calculation of the expression (1).

Figure 3:
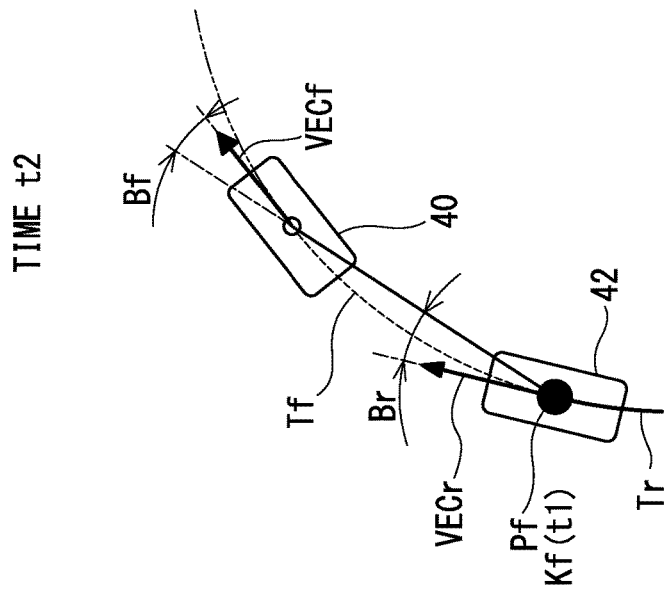
FIG. 3 is a diagram showing a state of calculating a rear wheel steering angle for rut travel.
Figure 3:
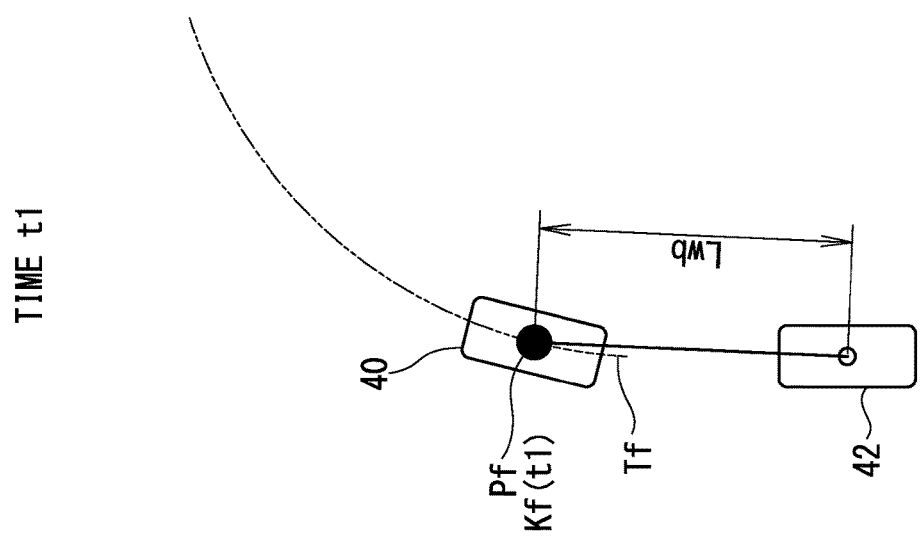

The vehicle behavior controller 12 calculates the rear wheel steering angle Br so that the rear wheel curvature Kr at a predetermined front wheel passing point coincides with the front wheel curvature Kf at the predetermined front wheel passing point. For example, in FIG. 3, consider a case where the front wheel 40 passes a predetermined front wheel passing point Pf at time t1. The front wheel curvature Kf at the front wheel passing point Pf is defined as Kf(t1). Then, at time t2, it is assumed that the rear wheel 42 has reached the front wheel passing point Pf. When the rear wheel curvature Kr at the front wheel passing point Pf is Kr(t2), the vehicle behavior controller 12 calculates a rear wheel steering angle Br that satisfies Kf(t1)=Kr(t2).

Specifically, the vehicle behavior controller 12 solves the following expression (3) for the rear wheel steering angle Br. The vehicle behavior controller 12 uses a value temporarily stored in the memory 16 as a value of Kf(t1).

$$Kf(t1) = Kr(t2) \quad (3)$$
$$= \left(\frac{1}{Lwb} \times \frac{\sin(Bf - Br)}{\cos Br} Vf + \frac{dBr}{dt}\right) \frac{\cos Br}{\cos Bf} \frac{1}{Vf}$$

By solving the expression (3), a rear wheel steering angle Br capable of rut travel is obtained. As described above, the front wheel steering angle Bf, the front wheel velocity Vf, and the rear wheel velocity Vr can be calculated from the driving instruction. Accordingly, by calculating the rear wheel steering angle Br, the target velocity vectors VECf and VECr capable of rutting are obtained. Thereafter, the vehicle behavior controller 12 sequentially calculates the target velocity vectors VECf and VECr capable of rutting in the same procedure.

It should be noted that the rut travel must be started in a state where the rear wheel 42 is positioned at the front wheel passing point. However, when the vehicle starts turning without performing the rut travel, a wheel difference occurs. Therefore, in this case, it is difficult to position the rear wheel 42 at the front wheel passing point. Therefore, the rut travel may be started during the straight travel of the vehicle. In the case of the straight traveling, the rear wheel 42 can be easily positioned at the front wheel passing point without complex calculation.

The rear wheel steering angle Br calculated here is a steering angle in the two-wheel model. Therefore, the calculated rear wheel steering angle Br cannot be directly applied to the four-wheeled vehicle except for a special situation. The special situation is a situation in which the vehicle is slow and the slip angle can be ignored. In this case, the calculated rear wheel steering angle Br and front wheel steering angle Bf can be directly applied to the four wheels.

Figure 4:
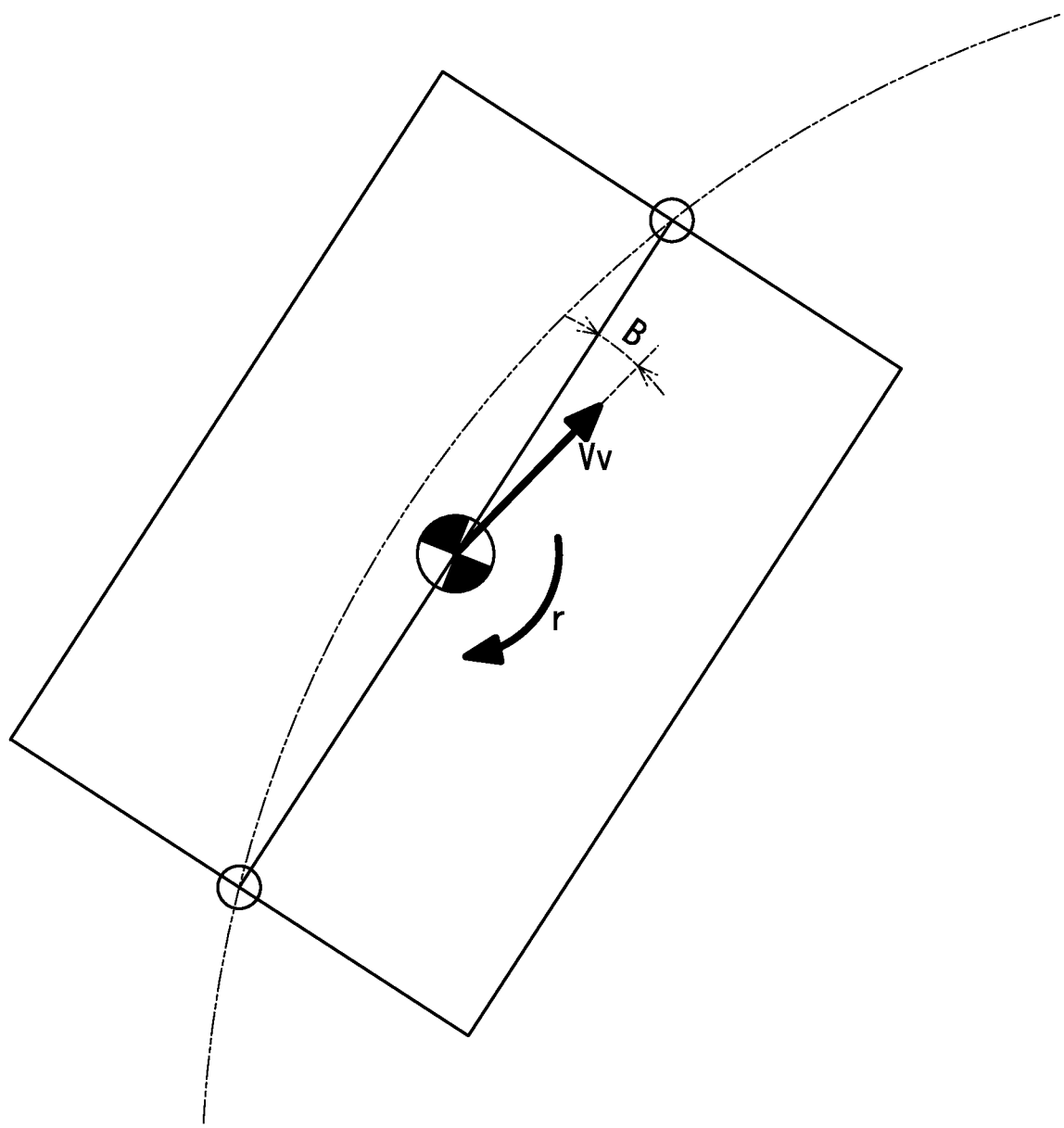
FIG. 4 is a schematic diagram of a rigid body model.
Figure 5:
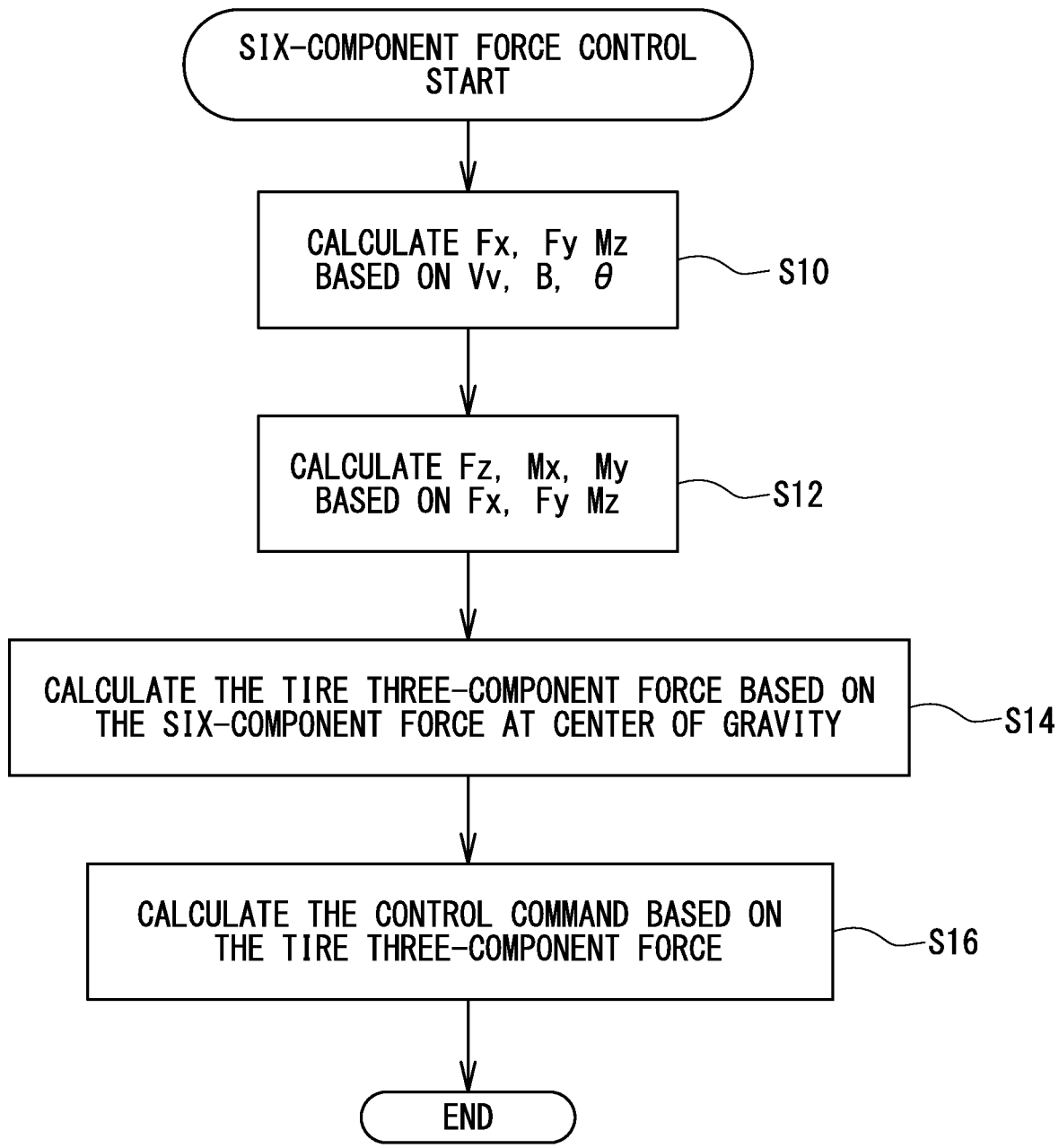
FIG. 5 is a flowchart showing a flow of a six-component force control process.

On the other hand, when the vehicle velocity Vv is large to some extent, the slip angle cannot be ignored. In this case, the vehicle behavior controller 12 converts the two-wheel model into a rigid body model. FIG. 4 is a schematic diagram of a rigid body model. The rigid body model represents the behavior of the vehicle by a vehicle velocity Vv at the center of gravity of the vehicle, a slip angle B, and a yaw rate θ. The slip angle B, the vehicle velocity Vv, and the yaw rate θ can be calculated by applying the target velocity vectors VECf and VECr to known conversion expressions.

Figure 6:
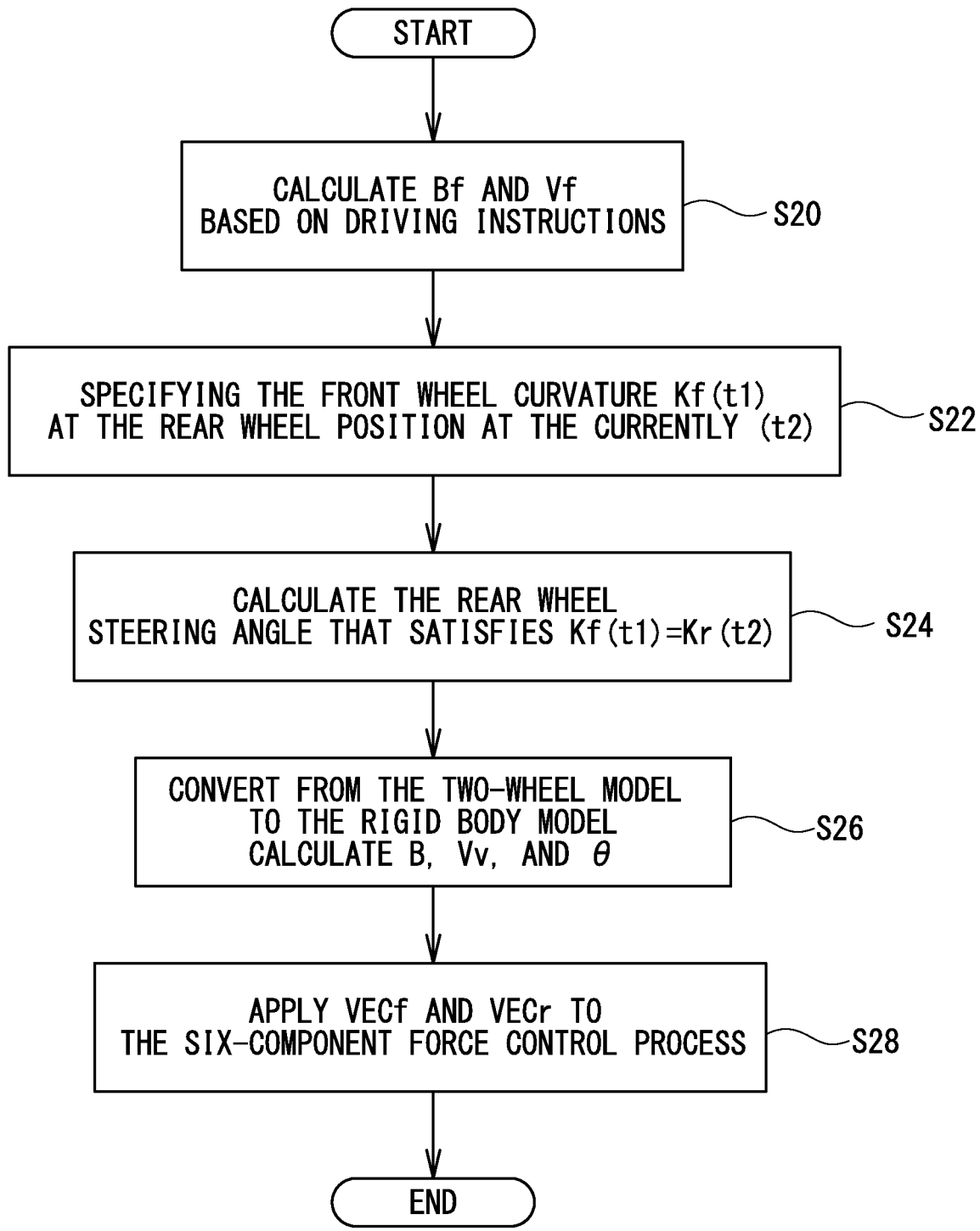
FIG. 6 is a flowchart showing a flow of rut travel control.

FIG. 6 is a flowchart showing a flow of rut travel control. In the case of performing the rut driving, the vehicle behavior controller 12 calculates the front wheel steering angle Bf and the front wheel velocity Vf based on the driving instruction (S20). Subsequently, the vehicle behavior controller 12 specifies the front wheel curvature Kf at the position (for example, the front wheel passing point Pf) of the rear wheel 42 at the present time (for example, at the time t2) (S22). Hereinafter, the front wheel curvature Kf specified in step S22 is denoted as "Kf(t1)".

When the current rear wheel curvature is Kr(t2), the vehicle behavior controller 12 solves Expression 3 described above to calculate a rear wheel steering angle Br that satisfies Kf(t1)–Kr(t2) (S24). Subsequently, the vehicle behavior controller 12 converts the two-wheel model into a rigid body model, and calculates a slip angle B, a vehicle velocity Vv, and a yaw rate θ based on the two target velocity vectors VECf and VECr (S26). When B, Vv, and θ can be calculated, the vehicle behavior controller 12 performs six-component force control processing using them as inputs (S28). Then, the same processing is repeated until the rut travel is finished.

As apparent from the above description, the vehicle behavior controller 12 disclosed in the present specification sequentially calculates the rear wheel steering angle Br in which the rear wheel curvature Kr coincides with the front wheel curvature Kf in order to enable rut travel. Then, the vehicle behavior controller 12 steers the wheels based on the obtained rear wheel steering angle Br. This makes it possible to perform the rutting travel well.

Further, the vehicle behavior controller 12 disclosed in the present specification converts the target velocity vectors VECf and VECr obtained by the two-wheel model into a rigid body model having a low dimension. By converting into a rigid body model, six-component force control processing disclosed in JP 2022-021715 A and JP 2022-165535 A can be easily utilized.

It should be noted that the configuration described above is an example, and other configurations may be changed as long as they include the configuration described in claim 1. For example, in the above description, the six-component force control process is used to calculate a control command for realizing rut travel. However, the control command of the vehicle control actuator group 26 may be directly calculated from the target velocity vectors VECf and VECr without using the six-component force control process.

REFERENCE SIGNS LIST

10 vehicle behavior control device, 12 vehicle behavior controller, 14 processor, 16 memory, 18 accelerator pedal sensor, 20 brake pedal sensor, 22 steering sensor, 23 path sensor, 24 autonomous travel system, 26 vehicle control actuator group, 28 drive actuator, 30 brake actuator, 32 front wheel steering actuator, 34 rear wheel steering actuator, 36 active stabilizer, 38 active suspension, 40 front wheel, 42 rear wheel, B slip angle, Bf front wheel steering angle, Br rear wheel steering angle, Kf front wheel curvature, Kr rear wheel curvature, Lwb wheel base, Pf front wheel passing point, Tf front wheel path, Tr rear wheel path, Vf front wheel velocity, Vr rear wheel velocity, Vv vehicle velocity.

The invention claimed is:

1. A vehicle behavior control device for controlling behavior of a vehicle, the vehicle behavior control device comprising:
a processor; and
a memory,
wherein the processor is configured to:
obtain a front wheel path;
calculate a front wheel curvature that is a curvature of the front wheel path at each of a plurality of front wheel passing points constituting the front wheel path;
sequentially calculate, for each of the plurality of front wheel passing points, a rear wheel steering angle at which a curvature of a rear wheel path coincides with the curvature of the front wheel path at each of the plurality of front wheel passing points; and
control driving of the front wheel and driving of the rear wheel based on the rear wheel steering angle that is calculated and a front wheel steering angle.

2. The vehicle behavior control device according to claim 1, wherein
the rear wheel steering angle is a steering angle satisfying the following expression 3:

$$Kf(t1) = Kr(t2) \qquad (3)$$
$$= \left(\frac{1}{Lwb} \times \frac{\sin(Bf - Br)}{\cos Br} Vf + \frac{dBr}{dt}\right) \frac{\cos Br}{\cos Bf} \frac{1}{Vf}$$

where the curvature of the front wheel path at each of the plurality of front wheel passing points is Kf(t1), a wheel base is Lwb, a front wheel vehicle velocity is Vf, the front wheel steering angle is Bf, and the rear wheel steering angle is Br.

3. The vehicle behavior control device according to claim 1, wherein
the vehicle is a four-wheeled vehicle having two front wheels and two rear wheels; and
the processor is configured to:
calculate a target velocity vector of each of the front wheel and the rear wheel based on a two-wheel model;
calculate behavior at a center of gravity of the vehicle based on the target velocity vector; and
control turning and driving forces of four wheels based on the behavior at the center of gravity of the vehicle.

4. The vehicle behavior control device according to claim 1, further comprising a path sensor for detecting the front wheel path,
wherein the processor is configured to calculate the curvature of the front wheel path at each of the plurality of front wheel passing points based on the front wheel path that is detected.

5. The vehicle behavior control device according to claim 1, wherein
the processor is configured to start, during a period in which the vehicle is traveling straight ahead, the calculating of the rear wheel steering angle at which the curvature of the rear wheel path coincides with the curvature of the front wheel path at each of the plurality of front wheel passage points.

* * * * *